(12) United States Patent
Chang et al.

(10) Patent No.: US 8,609,241 B2
(45) Date of Patent: Dec. 17, 2013

(54) COATED ARTICLE AND METHOD OF MAKING THE SAME

(75) Inventors: Hsin-Pei Chang, New Taipei (TW);
Wen-Rong Chen, New Taipei (TW);
Huann-Wu Chiang, New Taipei (TW);
Cheng-Shi Chen, New Taipei (TW);
Ying-Ying Wang, Shenzhen (CN)

(73) Assignees: Hong Fu Jin Precision Industry (ShenZhen) Co., Ltd, Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 163 days.

(21) Appl. No.: 13/172,244

(22) Filed: Jun. 29, 2011

(65) Prior Publication Data
US 2012/0196148 A1 Aug. 2, 2012

(30) Foreign Application Priority Data

Jan. 27, 2011 (CN) .................. 2011 1 0029630

(51) Int. Cl.
*B32B 9/00* (2006.01)
(52) U.S. Cl.
USPC ............ 428/336; 428/469; 428/472; 428/698
(58) Field of Classification Search
USPC .................................. 428/336, 469, 472, 698
See application file for complete search history.

(56) References Cited

FOREIGN PATENT DOCUMENTS

JP          2004-131752       *    4/2004

* cited by examiner

*Primary Examiner* — Archene Turner
(74) *Attorney, Agent, or Firm* — Altis Law Group, Inc.

(57) ABSTRACT

A coated article includes a magnesium layer, a magnesium oxynitride layer a titanium nitride layer formed on a substrate in that order. The substrate is made of magnesium alloy.

6 Claims, 2 Drawing Sheets

COATED ARTICLE AND METHOD OF MAKING THE SAME

BACKGROUND

1. Technical Field

This disclosure relates to a coated article and a method of making the coated article.

2. Description of Related Art

Magnesium alloys are widely used for their properties of lightweight and good heat dispersion. However, magnesium alloys are highly chemically active, and easily oxidized. The oxidants are loose, and the magnesium alloys are easily corroded in moisture including electrolytes. Thus, magnesium alloys need to have a surface treatment before being used. A typical surface treatment method for magnesium alloys is Physical vapor deposition (PVD). However, a film formed on the magnesium alloy by PVD is not density enough to effectively prevent the magnesium alloys from corrosion.

Therefore, there is room for improvement within the art.

BRIEF DESCRIPTION OF THE DRAWINGS

Many aspects of the coated article and method of making the same can be better understood with reference to the following drawings. The components in the drawings are not necessarily drawn to scale, the emphasis instead being placed upon clearly illustrating the principles of the coated article and method of making the same.

DETAILED DESCRIPTION

Figure 1:
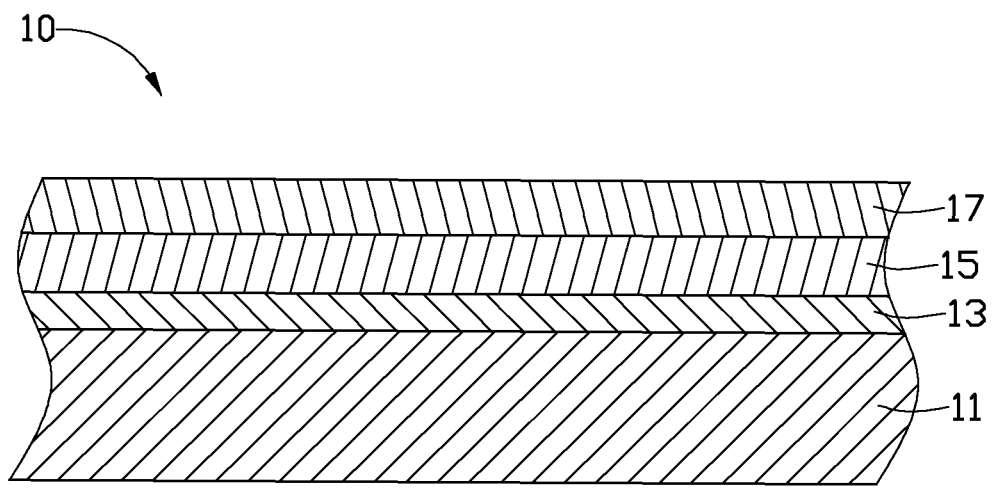
FIG. 1 is a schematic view of a coated article, in accordance with an exemplary embodiment.

FIG. 1 shows an exemplary embodiment of a coated article 10. The coated article 10 includes a magnesium layer 13, a magnesium oxynitride (MgON) layer 15, and a titanium nitride (TiN) layer 17 formed on a substrate 11 in that order. The substrate 11 is made of magnesium alloy. In this embodiment, the magnesium layer 13, the magnesium oxynitride layer 15 and the titanium nitride layer 17 are formed by magnetron sputtering. The magnesium layer 13 functions as a bonding layer having a thickness of about 20 nm to about 50 nm.

The magnesium oxynitride layer 15 is made up of nanocrystals, which make the layer immensely dense. The magnesium of the magnesium oxynitride layer 15 has an atomic percentage in a range from about 25% to about 40%. The oxygen of the magnesium oxynitride layer 15 has an atomic percentage in a range from about 25% to about 40%. The nitrogen of the magnesium oxynitride layer 15 has an atomic percentage in a range from about 20% to about 35%. The magnesium oxynitride layer 15 has a thickness from about 200 nm to about 300 nm.

The titanium nitride layer 17 has a thickness of about 100 nm to about 200 nm. The titanium nitride layer 17 has good hardness and abrasion properties to prevent the magnesium oxynitride layer 15 from wearing and scratching. The layer 17 can be made of other materials having good hardness and abrasion properties.

A method of making the coated article 10 includes the following steps:

A substrate 11 is provided. The substrate 11 is made of magnesium alloy.

The substrate 11 is immersed into an absolute ethanol solution and is cleaned by ultrasound for about 5 minutes (min) to about 10 min. Thus, stains on the surface of the substrate 11 are removed.

Figure 2:
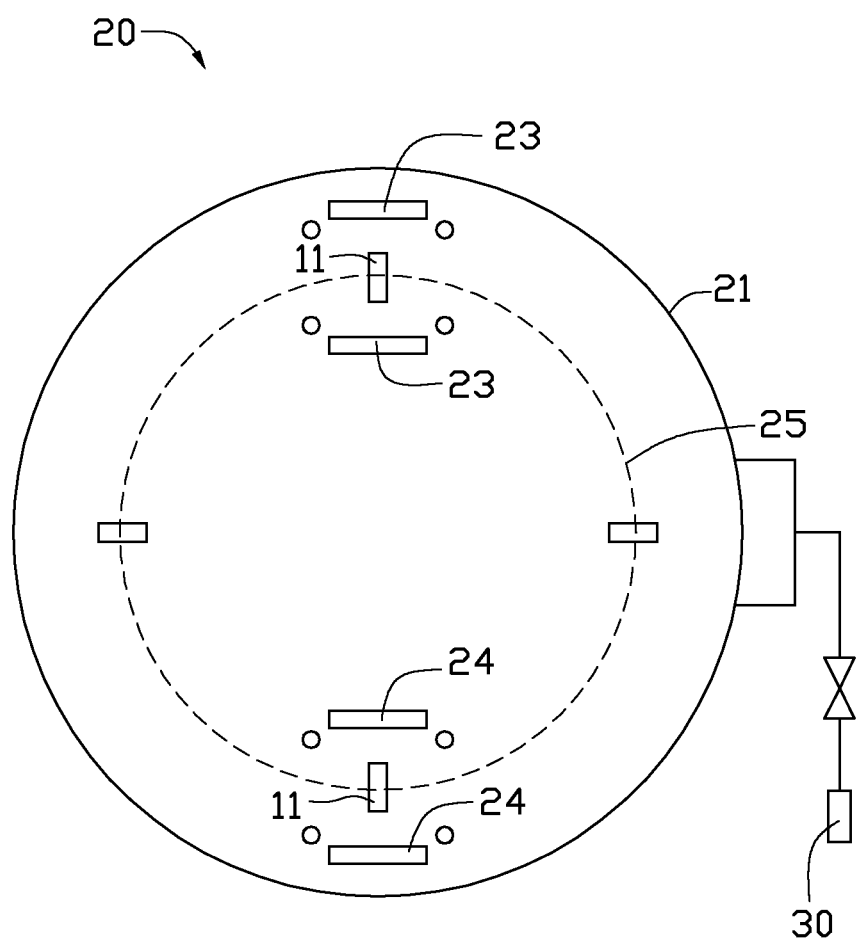
FIG. 2 is a schematic view of a vacuum sputtering coating machine applied to form the coated article shown in FIG. 1.

The substrate 11 is cleaned by argon gas plasma. This process can further remove oil on the substrate 11. This can increase a bonding force between the substrate 11 and the magnesium layer 13 formed on the substrate 11. Referring to FIG. 2, in this process, a vacuum sputtering coating machine 20 is used. The coating machine 20 includes a vacuum chamber 21 and a vacuum air pump 30 for evacuating the vacuum chamber 21. A rotating stand (not shown), two magnesium targets 23 and two titanium targets 24 are disposed in the vacuum chamber 21. The rotating stand rotates the substrate 11 along a circular trace 25 while the substrate 11 rotates along its own axis.

During cleaning, air in the chamber is evacuated until the pressure in the chamber 21 is about $3.0\times10^{-5}$ Pascals (Pa). Argon gas is then fed into the chamber 21 at a flow rate of about 500 standard cubic centimeter per minute (sccm). The purity of the argon gas is 99.9999%. A bias voltage in a range of about −200V to about −500V is applied to the substrate 11, and the substrate 11 is then cleaned with argon gas plasma. The cleaning time is from about 3 minutes (min) to about 10 min.

A magnesium layer 13 is formed on the substrate 11 by magnetron sputtering. The pressure in the chamber is about $3.0\times10^{-5}$ Pascals (Pa). The air in the chamber is heated to a temperature of about 80° C. to about 200° C. The magnesium targets 23 are activated. Power of each magnesium target 23 is set from about 3 kilowatt (kw) to about 10 kw. A bias voltage in a range of about −100 V to about −300 V is applied to the substrate 11. Argon gas is provided as a working gas having a flow rate in a range of about 100 sccm to about 300 sccm. The sputtering time is in a range from about 10 min to about 30 min. The magnesium layer 13 has a thickness of about 20 nm to about 50 nm.

A magnesium oxynitride layer 15 is formed on the magnesium layer 13 by magnetron sputtering. Oxygen gas and nitrogen gas as two reaction gases are fed into the vacuum chamber 21. A flow rate of the oxygen gas is in a range of about 80 sccm to about 120 sccm. A flow rate of the nitrogen gas is in a range of about 50 sccm to about 80 sccm. The other technological parameters are similar to those of the step of forming the magnesium layer. The sputtering time is in a range of about 60 min to about 90 min. The magnesium oxynitride layer 15 has a thickness of about 200 nm to about 300 nm.

A titanium nitride layer 17 is formed on the magnesium oxynitride layer 15 by magnetron sputtering. The magnesium targets 23 are closed and the titanium targets 24 are activated. The power of each titanium target 24 is set from about 3 kw to about 10 kw. A bias voltage in a range of about −100 V to about −300 V is applied to the substrate 11 with the layers 13, 15. Nitrogen gas as a reaction gas is fed into the vacuum chamber 21, having a flow rate in a range of about 50 sccm to about 80 sccm. Argon gas is provided as a working gas having a flow rate in a range of about 100 sccm to about 300 sccm. The sputtering time takes for about 30 min to about 60 min. The titanium nitride layer 17 has a thickness from about 100 nm to about 200 nm.

The present disclosure is described further in detail using examples as follows, but is not limited by the following examples.

EXAMPLE I

In this embodiment, the vacuum sputtering coating machine 20 is a mid-frequency magnetron sputtering machine.

During cleaning of the substrate 11 by argon gas plasma, the flow rate of the argon gas is about 500 sccm. A bias voltage of about −200V is applied to the substrate 11. The substrate 11 is cleaned with the argon gas plasma for about 10 min.

During forming of the magnesium layer 13, the flow rate of the argon gas is about 100 sccm. A bias voltage of about −100V is applied to the substrate 11. The substrate 11 is heated to at a temperature of about 80° C. The sputtering process takes about 5 min. The magnesium layer 13 has a thickness is about 20 nm.

During forming of the magnesium oxynitride layer 15, the flow rate of the argon gas is about 50 sccm. The other technological parameters are similar to the process of forming the magnesium layer 13. The sputtering time is about 60 min. A thickness of the magnesium oxynitride layer 15 is about 200 nm.

During forming of the titanium nitride layer 17, the flow rate of the nitrogen gas is about 50 sccm. The flow rate of the argon gas is about 100 sccm. The power of the titanium target is set to be about 3 kw. A bias voltage in a range of about −300 V is applied to the substrate 11 with the layers 13, 15. The sputtering process takes about 30 min. The titanium nitride layer 17 has a thickness of about 100 nm.

EXAMPLE II

In this embodiment, the vacuum sputtering coating machine 20 is similar to the first embodiment.

During cleaning of the substrate 11 by argon gas plasma, the flow rate of the argon gas is about 500 sccm. A bias voltage of about −500V is applied to the substrate 11. The substrate 11 is cleaned with the argon gas plasma for about 5 min.

During forming of the magnesium layer 13, the flow rate of the argon gas is about 300 sccm. The substrate 11 is heated to at a temperature of about 200° C. The sputtering process takes about 30 min. The magnesium layer 13 has a thickness of about 50 nm.

During forming of the magnesium oxynitride layer 15, the flow rate of the oxygen gas is about 120 sccm. The flow rate of the argon gas is about 80 sccm. The other technological parameters are similar to the process of forming the magnesium layer 13. The sputtering process takes about 90 min. The magnesium oxynitride layer 15 has a thickness of about 300 nm.

During forming of the titanium nitride layer 17, the flow rate of the nitrogen gas is about 80 sccm. The flow rate of the argon gas is about 300 sccm. The power of the titanium target is set to be about 10 kw. A bias voltage in a range of about −300 V is applied to the substrate 11 with the layers 13, 15. The sputtering process takes about 60 min. The titanium nitride layer 17 has a thickness of about 200 nm.

Salt Mist Test

A salt mist test is applied to the coated articles 10 achieved by the above methods. The articles 10 are set in a neutral salt mist, which includes about 5 percent of sodium chloride. A temperature of the neutral salt mist is about 35° C.

The test result shows that corrosion of the articles 10 does not start until the articles 10 have been in the neutral salt mist for about 72 hours.

The magnesium layer 13, the magnesium oxynitride layer 15 and the titanium nitride layer 17 are formed on the substrate 11 in that order. The layer system of the coated article 10 has a good transition, and no obvious stress is formed inside the layers. The magnesium oxynitride layer 15 is made of nanocrystals. The nanocrystals join together, making the layer immensely dense. Thus, the magnesium oxynitride layer 15 can effectively prevent the substrate made of magnesium alloy from corrosion of salt mist. The titanium nitride layer 17 has good hardness and abrasion properties to prevent the magnesium oxynitride layer 15 from wearing and scratching.

It is to be understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A coated article, comprising:
   a substrate made of magnesium alloy;
   a magnesium layer formed on the substrate;
   a magnesium oxynitride layer directly formed on the magnesium layer; and
   a titanium nitride layer directly formed on the magnesium oxynitride layer.

2. The coated article as claimed in claim 1, wherein the oxygen of the magnesium oxynitride layer 15 has an atomic percentage in a range from 25% to 40% and the nitrogen of the magnesium oxynitride layer 15 has an atomic percentage in a range from about 20% to about 35%.

3. The coated article as claimed in claim 1, wherein the magnesium layer is formed by magnetron sputtering and has a thickness in a range of about 20 nm to about 50 nm.

4. The coated article as claimed in claim 1, wherein the magnesium oxynitride layer is formed by magnetron sputtering and has a thickness in a range of about 200 nm to about 300 nm.

5. The coated article as claimed in claim 1, wherein the titanium nitride layer is formed by magnetron sputtering, and has a thickness in a range of about 100 nm to about 200 nm.

6. The coated article as claimed in claim 1, wherein the magnesium oxynitride layer is made of nanocrystals.

\* \* \* \* \*